United States Patent
Karasudani

(10) Patent No.: US 6,836,152 B2
(45) Date of Patent: Dec. 28, 2004

(54) ANALOG/DIGITAL MIXED INTEGRATED CIRCUIT

(75) Inventor: Munehiro Karasudani, Tokyo (JP)

(73) Assignee: Niigata Seimitsu Co., Ltd. (JP)

( * ) Notice: Subject to any disclaimer, the term of this patent is extended or adjusted under 35 U.S.C. 154(b) by 0 days.

(21) Appl. No.: 10/707,547

(22) Filed: Dec. 20, 2003

(65) Prior Publication Data

US 2004/0113660 A1 Jun. 17, 2004

Related U.S. Application Data

(63) Continuation of application No. PCT/JP02/06973, filed on Jul. 10, 2002.

(30) Foreign Application Priority Data

Jul. 23, 2001 (JP) .......................................... 2001-220879

(51) Int. Cl.[7] .............................................. H03K 19/00
(52) U.S. Cl. ........................... 326/136; 326/47; 327/565
(58) Field of Search ................... 326/47, 136; 327/564, 327/565; 257/691–694, 696–698; 341/118, 155

(56) References Cited

U.S. PATENT DOCUMENTS

| | | | | |
|---|---|---|---|---|
| 5,373,293 A | * | 12/1994 | Hirata | ......................... 341/118 |
| 5,617,037 A | * | 4/1997 | Matsumoto | .................. 324/763 |
| 6,121,827 A | * | 9/2000 | Khoini-Poorfard et al. | . 327/565 |
| 6,556,046 B1 | * | 4/2003 | St. Amand et al. | ........... 326/63 |

FOREIGN PATENT DOCUMENTS

| | | |
|---|---|---|
| JP | 05-308122 | 11/1993 |
| JP | 2001-024156 | 1/2001 |

* cited by examiner

*Primary Examiner*—Vibol Tan
(74) *Attorney, Agent, or Firm*—Connolly Bove Lodge & Hutz LLP; Larry J. Hume, Esq.

(57) ABSTRACT

An IC chip 10 is divided into the analog circuit area 1 and a digital circuit area 2 in its layout. A clock generator circuit 6 that generates a clock signal CK is arranged within the digital circuit area 2, and a switching circuit 4 that performs switching operations by the clock signal CK is also arranged within the digital circuit area 2. This enables shortening of the wiring length of the clock line 9, which is routed from the clock generator circuit 6 to the switching circuit 4, and also enables the distance between the clock line 9 and the analog circuits within the analog circuit area 1 to be as great as possible. Through this, inconvenience where digital noise caused by the clock signal flowing through the clock line 9 jumps into analog circuits can be suppressed.

4 Claims, 2 Drawing Sheets

ANALOG/DIGITAL MIXED INTEGRATED CIRCUIT

CROSS REFERENCE TO RELATED APPLICATIONS

This Application is a Continuation of application PCT/JP02/06973 filed on Jul. 10, 2002, and which claims priority from Japanese application 2001-220879 filed on Jul. 23, 2001, the entire contents of each of which are incorporated herein by reference.

FIELD OF THE INVENTION

The present invention relates to an analog/digital mixed integrated circuit by which an analog circuit and a digital circuit are integrated within a single semiconductor chip.

BACKGROUND OF THE INVENTION

In recent years, in addition to cellular-phone equipment and PDA (Personal Digital Assistants), many electronics devices, including entertainment equipment such as radio receiver, digital camera, and game machine, etc.; home electronics such as air conditioner and refrigerator; vending machine; manufacturing equipment in a factory; measuring apparatus; in-vehicle equipment such as car navigation system, etc.; and business equipment, etc., have means of communication, and have been utilized as network terminals.

Under such a networked environment, wireless communications make communication "whenever, wherever, and to whomever" possible. As means of wireless communications, there are Bluetooth for short-distance wireless data communication technology, and wireless LAN using an addition to cellular-phone system or a 5 GHz band, in addition to cellular-phone system or PDA.

Regarding such communication terminals, "being ultra-portable" is a prerequisite as a matter of course. Thus, miniaturization, light weight, and low-power consumption are strongly required. Generally speaking, wireless communication terminals tend to have multifunctions and high performance. Even so, regarding the entirety of equipment, miniaturization, light weight, and low-power consumption are required. Therefore, for the wireless communication functions built-in equipment, further miniaturization, light weight, thinness, and low-power consumption are required.

In light of such a background, the development of multifunctions, high integration, and high density for semiconductor integrated circuits has rapidly progressed. Trials in which radio frequency circuits including passive component parts such as condensers, etc., are made into a single chip or a single modularization have been performed. Recently, there have also been developments in which the past independence of analog LSI and digital LSI has given way to integration in the form of an analog/digital mixed LSI.

For example, trials where radio frequency circuit (analog circuit) used to transmit and receive analog signals, and PLL (Phase Locked Loop) synthesizer circuit (digital circuit) or baseband signal processing circuit (digital circuit) used so as to perform digital signal processing of the signals to transmit and received signals are made into a single chip or a single modulation have been actively made.

The analog circuit and digital circuit in an analog/digital mixed integrated circuit are arranged adjacently each other, compared with the structure where analog and digital circuits are arranged on separate chips. Thus, in many cases, significant noise from the digital circuit tends to enter the supersensitive analog circuit. In such cases, the characteristics of the analog signals become extremely deteriorated. Therefore, the way in which such coupling noise arising from analog and digital circuits is reduced is very important.

In particular, for the digital circuit, a clock signal as a control standard is supplied. In such a case, when an analog circuit (for example, a high frequency circuit) is arranged near an digital circuit, high frequency components of the clock signal jump into the analog circuit as digital noise, which largely deteriorates the characteristics of the analog signals transmitted and received wirelessly. For instance, when audio signals are transmitted and received, the receiving sensitivity declines, and the sound quality becomes remarkably deteriorated, which causes extreme difficulty in terms of hearing.

Therefore, for example, a front-end part of a high frequency circuit, etc. is composed of an analog circuit, and the baseband signal processing circuit is composed of a digital circuit, etc. So, either the analog circuit or the digital circuit is organized according to functional unit. This separates the analog circuit area from the digital circuit area on the chip layout.

However, as shown in FIG. 1, depending on uses of an analog/digital mixed integrated circuit, there exist some circuits switching through the clock signal even within the analog circuit area (in this specification, an operated circuit based on the clock signal is called a switching circuit).

Meanwhile, a clock generator circuit that generates a clock signal is normally arranged in the digital circuit area. In such case, the length of a clock line that is wired from the clock generator circuit arranged in the digital circuit area to a switching circuit arranged in the analog circuit area becomes long. However, the intervals between wirings or between parts become very narrow for high-integration and high-density-ized analog/digital mixed integrated circuits. Thus, the influence of the clock signal flowing through the long clock line upon the surroundings becomes large.

In particular, when a high frequency amplification circuit, etc. corresponding to the transmission and reception section of the high frequency signals exits near the clock line, the digital noise by the clock signal jumps into the high frequency amplification circuit, which causes the characteristics of the analog signals to become remarkably deteriorated. Energies of the clock signal become larger as the frequency becomes higher. Thus, the problem stated above becomes more remarkable as the frequency of the clock signal becomes higher.

The purpose of the present invention is to suppress the inconvenience where the digital noise by the clock signal flowing through the clock line is received by the analog circuit, and the quality of the analog signals becomes deteriorated.

SUMMARY OF THE INVENTION

An analog/digital mixed integrated circuit of the present invention mixes analog circuits and digital circuits within the same semiconductor chip, an analog circuit area and a digital circuit area are held within the semiconductor chip, a clock generator circuit that generates a clock signal is arranged within the digital circuit area, and a switching circuit that performs switching operation by the clock signal and performs analog signal processing is arranged within the digital circuit area.

Here, the switching circuit is preferably arranged near the clock generator circuit.

In another aspect of the present invention, an analog/digital mixed integrated circuit mixes analog circuits and digital circuits within the same semiconductor chip, the semiconductor chip includes a first switching circuit that operates based on a clock signal with a first frequency and performs analog signal processing, a second switching circuit that operates based on a clock signal with a second frequency higher than the first frequency and performs analog signal processing, and a clock generator circuit that generates a clock signal with the first and second frequency, and an analog circuit area and a digital circuit area are held within the semiconductor chip, the first switching circuit is arranged within the analog circuit area, and the second switching circuit and the clock generator circuit are arranged within the digital circuit area.

Here, the second switching circuit is preferably arranged near the clock generator circuit.

According to this present invention, shortening of the wiring length of the clock line that is routed from the clock generator circuit arranged within the digital circuit area of the semiconductor chip to the switching circuit that operates based on the clock signal is possible. Furthermore, the distance between the clock line and the analog circuits within the analog circuit area can be as great as possible. The distance between the switching circuit itself and the analog circuits within the analog circuit area can also be as great as possible.

DETAILED DESCRIPTION OF THE PREFERRED EMBODIMENTS

First Embodiment

Figure 1:
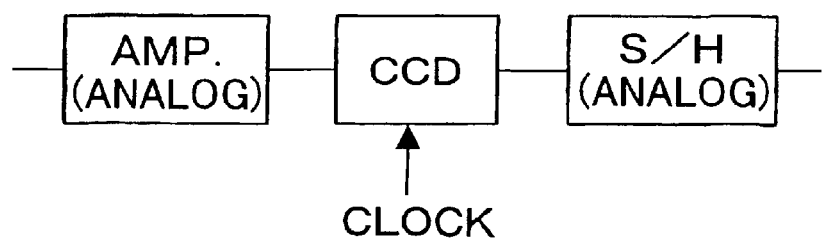
FIG. 1 is a diagram showing an example where a circuit that performs switching operation by the clock signal exists between analog circuits.

The first embodiment of the present invention is hereinafter explained with reference to the drawing.

Figure 2:
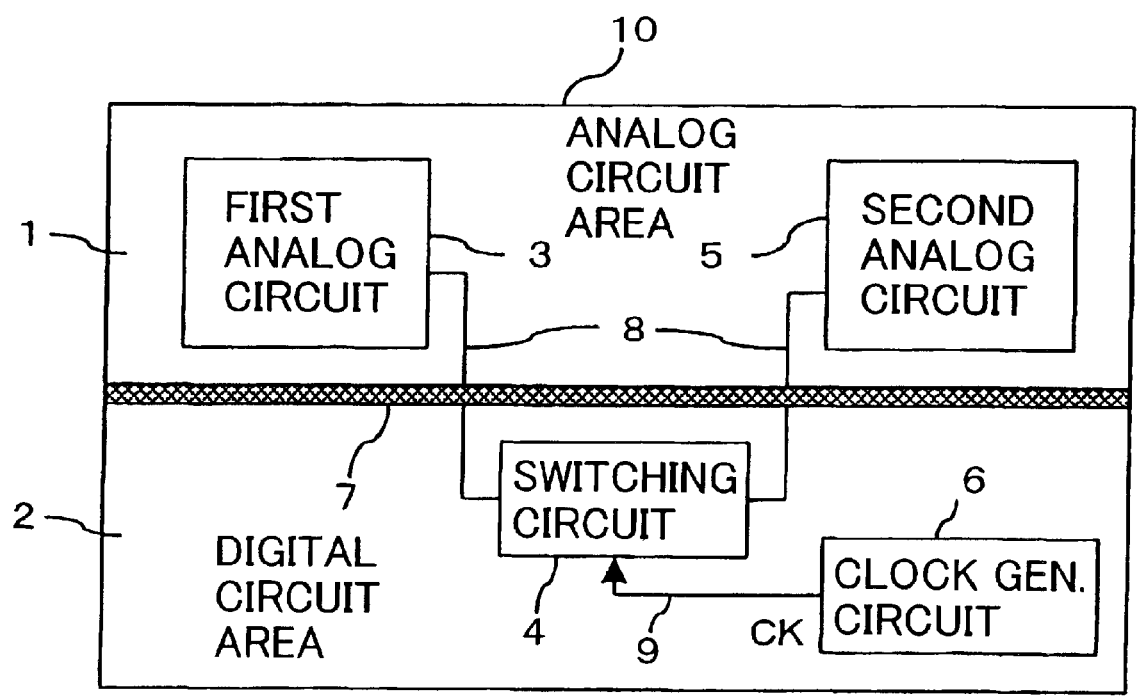
FIG. 2 is a diagram showing an example of chip layout of the analog/digital mixed integrated circuit of the first embodiment.

FIG. 2 is a diagram showing an example of chip layout of the analog/digital mixed integrated circuit of the first embodiment.

As shown in FIG. 2, the IC chip 10 of this embodiment that mixes analog circuits and digital circuits integrates the first analog circuit 3, the switching circuit 4, the second analog circuit 5, and the clock generator circuit 6. The switching circuit 4 operates based on the clock signal CK and inputs and processes the output signal of the first analog circuit 3. The second analog circuit 5 inputs and processes the output signal of the switching circuit 4. The clock generator circuit 6 generates the aforementioned clock signal CK.

Such IC chip 10 has an analog circuit area 1 that collectively integrates the analog circuits and a digital circuit area 2 that collectively integrates the digital circuits. A guard ring 7 is formed on the boundary between the analog circuit area 1 and the digital circuit area 2.

In addition, regarding each circuit 3 to 6 shown here, only some of the circuits integrated within the IC chip 10 are illustrated, and circuits other than those may be integrated within the IC chip 10. Note that, the analog circuits should be integrated within the analog circuit area 1 and the digital circuits should be integrated within the digital circuit area 2.

In this embodiment, the analog circuit area 1 integrates the first analog circuit 3 and the second analog circuit 5. Also, the digital circuit area 2 integrates the switching circuit 4 (regardless of whether it is an analog or a digital circuit) and the clock generator circuit 6.

The first analog circuit 3 and the second analog circuit 5 are arranged in the analog circuit area 1, and the switching circuit 4 as a processing circuit between them is arranged in the digital circuit area 2. Though this, the wiring lengths of the signal line 8 between the first analog circuit 3 and the switching circuit 4, and between the switching circuit 4 and the second analog circuit 5 become longer than in a case where the switching circuit 4 is also arranged in the analog circuit area 1 in a normal manner.

However, the distance between the switching circuit 4 and the clock generator circuit 6 becomes short, and the wiring length of the clock line 9 used to supply the clock signal CK with the switching circuit 4 can be short. Regarding the analog circuit, the fact that the clock line 9 as the origin of occurrence for large digital noise is routed over lengthily to the inside of the analog circuit area 1 causes a more serious problem than a fact that the signal line 8 becomes longer.

The switching circuit 4 is arranged in the digital circuit area 2. This enables the clock line 9 not to enter the analog circuit area 1. Therefore, inconvenience where the digital noise by the clock signal CK jumps to the analog circuits can be suppressed. Furthermore, since the guard ring 7 is formed between the analog circuit area 1 and the digital circuit area 2, mixing-in of digital noise can be more reliably suppressed.

In particular, when a sensitive high frequency amplification circuit exists within the analog circuit area 1, such high frequency amplification circuit can be arranged as distantly from the clock line 9 as possible. This enables the suppression of the inconvenience where the digital noise by the clock signal CK jumps into the high frequency amplification circuit and the characteristics of the analog signals become deteriorated.

Moreover, the switching circuit 4 is arranged within the digital circuit area 2. This enables the distance of the switching circuit 4 itself and the analog circuits within the analog circuit area 1 to be as remotely separated as possible.

Furthermore, it is possible to separate the switching circuit 4 and analog circuits within the analog circuit area 1 to be separated by the guard ring 7. This also enables the suppression of the inconvenience where the switching noise occurring in the switching circuit 4 jumps into the analog circuits and the characteristics of the analog signals become deteriorated.

Additionally, the switching circuit 4 within the digital circuit area 2 is preferably arranged near the clock generator circuit 6, so that the wiring length of the clock line 9 becomes as short as possible.

Second Embodiment

Next, the second embodiment of the present invention is hereinafter explained based on the drawing.

Figure 3:
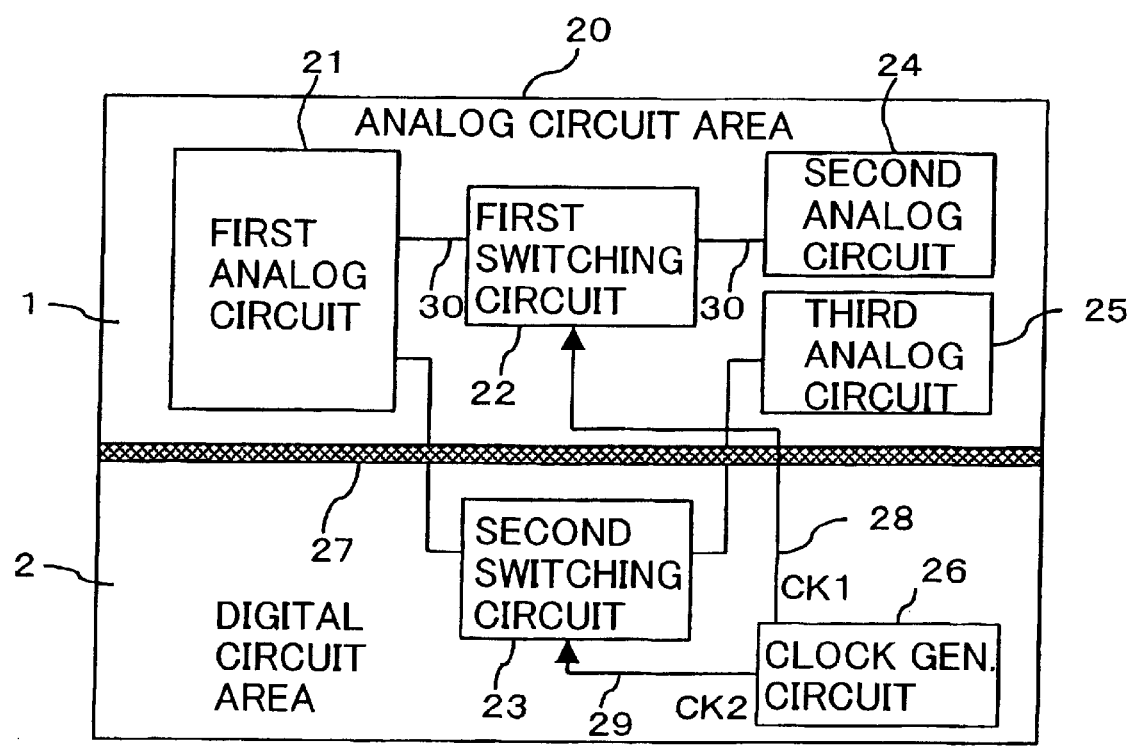
FIG. 3 is a diagram showing an example of chip layout of the analog/digital mixed integrated circuit of the second embodiment.

FIG. 3 is a diagram showing an example of chip layout of the analog/digital mixed integrated circuit of the second embodiment.

The IC chip 20 of this embodiment integrates the first analog circuit 21, the first switching circuit 22, the second switching circuit 23, the second analog circuit 24, the third analog circuit 25, and the clock generator circuit 26. The first switching circuit 22 operates based on the first clock signal CK 1 and inputs and processes the output signal of the first analog circuit 21. The second switching circuit 23 operates based on the second clock signal CK 2 and inputs and processes the output signal of the first analog circuit 21. The second analog circuit 24 inputs and processes the output signal of the first switching circuit 22. The third analog circuit 25 inputs and processes the output signal of the second switching circuit 23. The clock generator circuit 26 generates the aforementioned clock signal CK 1 and CK 2.

Such IC chip 20 also has an analog circuit area 1 that collectively integrates the analog circuits and a digital circuit area 2 that collectively integrates the digital circuits. A guard ring 27 is formed on the boundary between the analog circuit area 1 and the digital circuit area 2.

Regarding the first and second clock signals CK 1 and CK 2 generated by the clock generator circuit 26, the frequency of the second clock signal CK 2 is higher than that of the first clock signal CK 1. Thus, the second clock signal CK 2 has larger energies than the first clock signal CK 1.

In addition, regarding each circuit 21 to 26 shown here, only some of the circuits integrated within the IC chip 20 are illustrated, and circuits other than those may be integrated within the IC chip 20. Note that, the analog circuits should be integrated within the analog circuit area 1 and the digital circuits should be integrated within the digital circuit area 2.

In this embodiment, the analog circuit area 1 integrates the first analog circuit 21, the first switching circuit 22, the second analog circuit 24 and the third analog circuit 25. Also, the digital circuit area 2 integrates the second switching circuit 23 and the clock generator circuit 26.

The first analog circuit 21 and the third analog circuit 25 are arranged in the analog circuit area 1, and the second switching circuit 23 as a processing circuit between them is arranged in the digital circuit area 2. Though this, the distance between the second switching circuit 23 and the clock generator circuit 26 becomes short, and the wiring lengths of the second clock line 29 used to supply the second clock signal CK 2 with the switching circuit 23 can be shortened.

As stated above, the frequency of the second clock signal CK 2 is higher than that of the first clock signal CK 1. And the second clock signal CK2 has larger energies. Thus, when the second clock line 29 through which such second clock signal CK 2 flows is routed over lengthily to the inside of the analog circuit area 1, a significant amount of digital noise jumps into the analog circuits in many cases.

However, according to this embodiment, the second switching circuit 23 is arranged within the digital circuit area 2. This enables the second clock line 29 not to enter the analog circuit area 1, and suppresses the inconvenience where the digital noise by the second clock signal CK 2 jumps into the analog circuits. Furthermore, since the guard ring 27 is formed between the analog circuit area 1 and the digital circuit area 2, mixing-in of the digital noise can be more reliably suppressed.

In addition, the second switching circuit 23 within the digital circuit area 2 is preferably arranged near the clock generator circuit 26, so that the wiring length of the second clock line 29 becomes as short as possible.

Meanwhile, the first switching circuit 22 as a processing circuit between the first analog circuit 21 and the second analog circuit 24 is arranged in the same analog circuit area 1 as such first and second analog circuits 21 and 24. The frequency of the first clock signal CK 1 that is supplied to the first switching circuit 22 is lower than that of the second clock signal CK 2. And the influence of the digital noise by such first clock signal CK 1 is not extremely significant.

Thus, the wiring length of the first clock line 28 that is routed from the clock generator circuit 26 to the switching circuit 22 is slightly longer, since the first switching circuit 22 is arranged in the analog circuit area 1. However, the wiring lengths of the signal line 30 between the first analog circuit 21 and the first switching circuit 22 and between the first switching circuit 22 and the second analog circuit 24 can be shortened.

The characteristics of this embodiment are such that when there exist a plurality of the switching circuits that operate according to the clock signal with different frequencies, a switching circuit where the frequency of the clock signal is high and the influence by digital noise becomes large is arranged in the digital circuit area 2. This enables the suppression of the inconvenience where the digital noise by the clock signal with large energies jumps into the analog circuits and the characteristics of the analog signals become deteriorated.

Additionally, the embodiments explained above have shown only one example of the possible incarnations upon implementing the present invention. This should not cause the technical scope of the present invention to be restrictively interpreted. This is to say, the present invention can be implemented in various forms without deviating from the spirit or the main characteristics thereof.

As explained above, the present invention enables shortening of the wiring length of the clock line that is routed from the clock generator circuit arranged within the digital circuit area of the semiconductor chip to the switching circuit that operates based on the clock signal, and also enables the distance between the clock line and the analog circuits within the analog circuit area to be as great as possible. This enables the suppression of the inconvenience where the digital noise by the clock signal flowing through the clock line jumps into the analog circuits and the coupling noise arising from analog and digital circuits is reduced.

Industrial Applicability

The present invention is useful in that it allows the possibility of suppressing inconvenience where digital noise caused by a clock signal flowing through the clock line is received by the analog circuits, and the quality of analog signals becomes deteriorated.

What is claimed is:

1. An analog/digital mixed integrated circuit that mixes analog circuits and digital circuits within the same semiconductor chip, comprising:

an analog circuit area and a digital circuit area within said semiconductor chip;

a clock generator circuit that generates a clock signal within said digital circuit area; and a switching circuit that performs switching operation by said clock signal and performs analog signal processing within said digital circuit area.

2. The analog/digital mixed integrated circuit according to claim 1, wherein said switching circuit is arranged near said clock generator circuit.

3. An analog/digital mixed integrated circuit that mixes analog circuits and digital circuits within the same semiconductor chip, comprising:

a first switching circuit that operates based on a clock signal with a first frequency and performs analog signal processing;

a second switching circuit that operates based on a clock signal with a second frequency higher than said first frequency and performs analog signal processing; and a clock generator circuit that generates a clock signal with said first and second frequency;

wherein an analog circuit area and a digital circuit area are held within said semiconductor chip, said first switching circuit is arranged within said analog circuit area, and said second switching circuit and said clock generator circuit are arranged within said digital circuit area.

4. The analog/digital mixed integrated circuit according to claim 3, wherein said second switching circuit is arranged near said clock generator circuit.

* * * * *